(12) United States Patent
Singh et al.

(10) Patent No.: US 10,644,149 B1
(45) Date of Patent: May 5, 2020

(54) LDMOS FIN-TYPE FIELD-EFFECT TRANSISTORS INCLUDING A DUMMY GATE

(71) Applicant: GLOBALFOUNDRIES Inc., Grand Cayman (KY)

(72) Inventors: Jagar Singh, Clifton Park, NY (US); Jerome Ciavatti, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/172,109

(22) Filed: Oct. 26, 2018

(51) Int. Cl.
*H01L 29/66* (2006.01)
*H01L 29/78* (2006.01)
*H01L 29/10* (2006.01)
*H01L 29/08* (2006.01)

(52) U.S. Cl.
CPC ...... *H01L 29/7816* (2013.01); *H01L 29/0865* (2013.01); *H01L 29/0882* (2013.01); *H01L 29/1033* (2013.01); *H01L 29/66545* (2013.01); *H01L 29/66681* (2013.01)

(58) Field of Classification Search
CPC .......................... H01L 29/66545; H01L 29/785
See application file for complete search history.

(56) References Cited

U.S. PATENT DOCUMENTS

| 7,405,443 | B1 | 7/2008 | Zuniga et al. |
| 2003/0001198 | A1 | 1/2003 | Bromberger et al. |
| 2007/0228425 | A1 | 10/2007 | Miller et al. |
| 2014/0015048 | A1 | 1/2014 | Ng et al. |
| 2015/0035053 | A1 | 2/2015 | Singh |
| 2018/0122705 | A1* | 5/2018 | Chen ............... H01L 21/823807 |

* cited by examiner

*Primary Examiner* — Thomas L Dickey
(74) *Attorney, Agent, or Firm* — Thompson Hine LLP; Francois Pagette (57) ABSTRACT

Structures for a laterally-diffused metal-oxide-semiconductor device and methods of forming a laterally-diffused metal-oxide-semiconductor device. A fin projects from a substrate, a channel region and a drain extension are arranged in a first section of the fin and the substrate beneath the first section of the fin, a source region is arranged in the first section of the fin, a drain region is arranged in a second section of the fin and the substrate beneath the second section of the fin, and a gate structure is arranged over the channel region. The drain region and the source region have an opposite conductivity type from the channel region. A trench isolation region is arranged in the fin between the first section of the fin and the second section of the fin. A dummy gate is arranged over a portion of the second section of the fin.

19 Claims, 5 Drawing Sheets

FIG. 6

LDMOS FIN-TYPE FIELD-EFFECT TRANSISTORS INCLUDING A DUMMY GATE

BACKGROUND

The present invention relates to semiconductor device fabrication and integrated circuits and, more specifically, to structures for a laterally-diffused metal-oxide-semiconductor device and methods of forming a laterally-diffused metal-oxide-semiconductor device.

Device structures for a field-effect transistor generally include a source, a drain, and a gate electrode configured to switch carrier flow in a channel region arranged between the source and drain. When a control voltage exceeding a designated threshold voltage is applied to the gate electrode, carrier flow occurs in the channel region to produce a device output current. A fin-type field-effect transistor provides a device structure that that exhibits better electrostatic control of the channel region for improved Ion/Ioff compared to planar field-effect transistors.

High-voltage integrated circuits used, for example, in microwave/RF power amplifiers typically require specialized circuit technology capable of withstanding higher voltages. Laterally-diffused metal-oxide-semiconductor (LDMOS) devices are designed to handle higher voltages than logic field-effect transistors and may include additional features, such as an extended drain, that promote the higher voltage handling capability. Laterally-diffused metal-oxide-semiconductor devices may have a narrow safe operating area (SOA), which is defined as the voltage and current conditions over which the device structure can be expected to operate without experiencing self-damage, because of restrictions on breakdown voltage. For example, handling voltages exceeding nine volts may significantly increase the risk of breakdown and limit the safe operating area.

Improved structures for a laterally-diffused metal-oxide-semiconductor device and methods of forming a laterally-diffused metal-oxide-semiconductor device are needed.

SUMMARY

In an embodiment of the invention, a structure is provided for a laterally-diffused metal-oxide-semiconductor field-effect transistor. The structure includes a substrate, a fin that projects from the substrate, a channel region and a drain extension in a first section of the fin and the substrate beneath the first section of the fin, a source region in the first section of the fin, a drain region in a second section of the fin and the substrate beneath the second section of the fin, and a gate structure over the channel region in the first section of the fin. The drain region and the source region have a first conductivity type, and the channel region has a second conductivity type opposite from the first conductivity type. A trench isolation region is arranged in the fin between the first section of the fin and the second section of the fin. A dummy gate is arranged over a portion of the second section of the fin.

In an embodiment of the invention, a method is provided for fabricating a laterally-diffused metal-oxide-semiconductor field-effect transistor. The method includes forming a fin projecting from a substrate, forming a channel region and a drain extension in a first section of the fin and the substrate beneath the first section of the fin, forming a drain region in a second section of the fin and the substrate beneath the first section of the fin, forming a source region in the first section of the fin, and forming a gate structure over the channel region in the first section of the fin. The drain region and the source region have a first conductivity type, and the channel region has a second conductivity type opposite from the first conductivity type. The method further includes forming a trench isolation region arranged in the fin between the first section of the fin and the second section of the fin, and forming a dummy gate over a portion of the second section of the fin.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
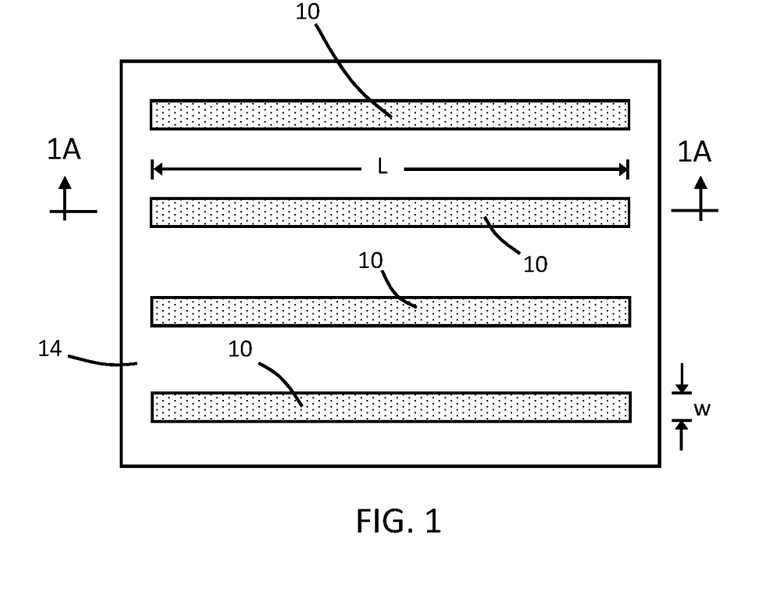
FIG. 1 is a top view of a device structure at an initial fabrication stage of a processing method in accordance with embodiments of the invention.
Figure 1A:
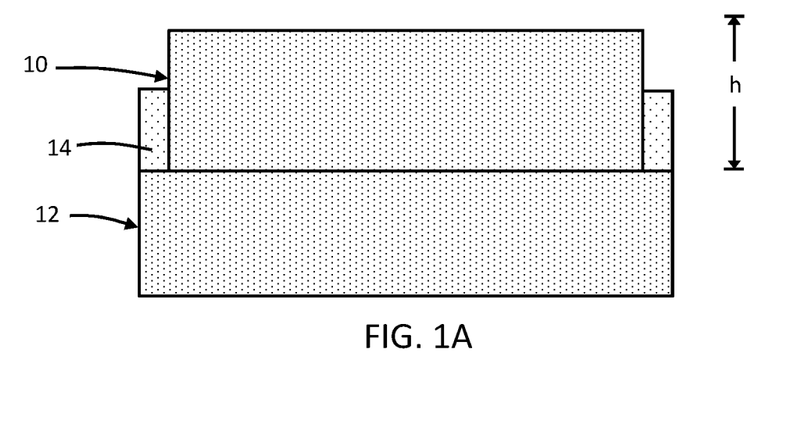
FIG. 1A is a cross-sectional view taken generally along line 1A-1A in FIG. 1.

With reference to FIGS. 1, 1A and in accordance with embodiments of the invention, fins 10 each extend or project in a vertical direction from a substrate 12, such as a bulk single-crystal silicon substrate. The fins 10 may be formed by patterning the substrate 12 or an epitaxial layer containing a semiconductor material, such as single-crystal silicon, grown on the substrate 12. The fins 10 and substrate 12 may be initially doped to provide a given conductivity type, such as lightly-doped p-type conductivity. The fins 10 are three-dimensional bodies that include a width, w, and a length, l, providing a cross-sectional area and a height, h, that is measured from a top surface of each fin 10 relative to the interface with the substrate 12.

The fins 10 may be surrounded by shallow trench isolation 14 that is formed over the substrate 12 and between the fins 10. The shallow trench isolation 14 may be composed of a dielectric material, such as silicon dioxide, that is deposited, polished with chemical-mechanical planarization, and recessed with an etching process. Each fin 10 includes an upper active region that is revealed above the level of the shallow trench isolation 14 and a lower region that is arranged below the level of the shallow trench isolation 14.

Figure 2:
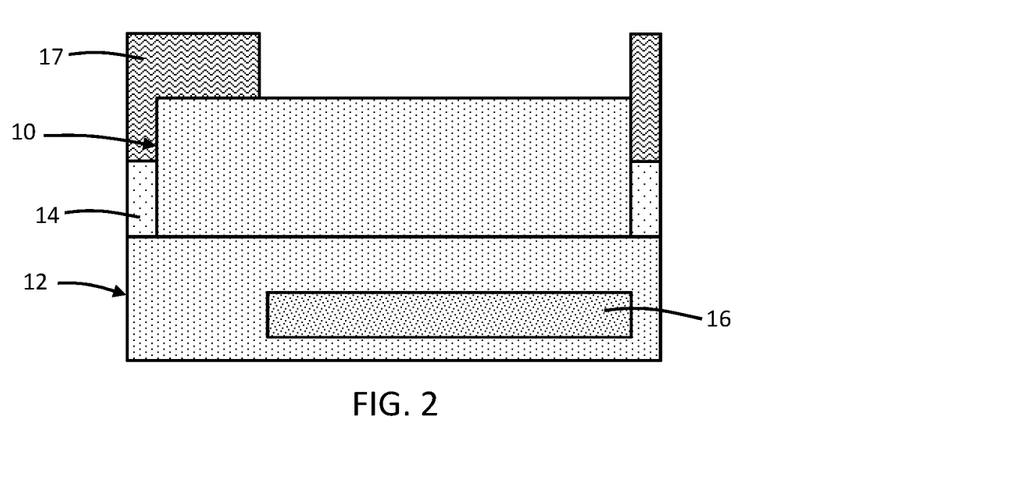
FIG. 2 is a cross-sectional view of the device structure at a fabrication stage of the processing method subsequent to FIGS. 1, 1A.

With reference to FIG. 2 in which like reference numerals refer to like features in FIGS. 1, 1A and at a subsequent fabrication stage, a deep well 16 having, for example, n-type conductivity is formed in the substrate 12 beneath the fins 10. The deep well 16 may be formed by, for example, ion implantation with an implantation mask 17 covering an area over the fins 10 and substrate 12 to determine the implanted region of the substrate 12. The implantation mask 17 may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the deep well 16. In an embodiment, the semiconductor material of the deep well 16 may be doped with an n-type dopant (e.g., phosphorus (P) and/or arsenic (As)) that provides n-type conductivity.

Figure 3:
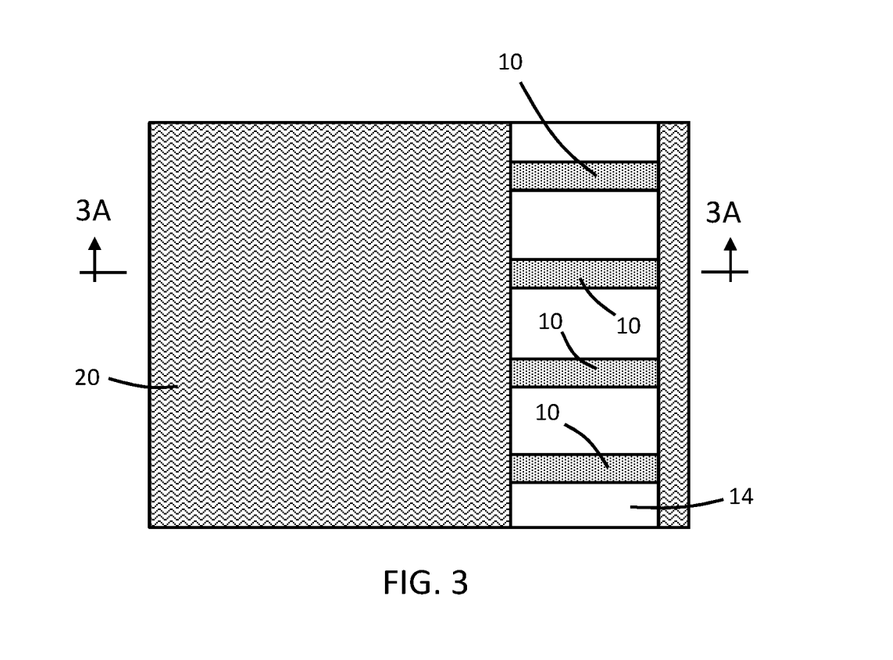
FIG. 3 is a top view of the device structure at a fabrication stage of the processing method subsequent to FIG. 2.
Figure 3A:
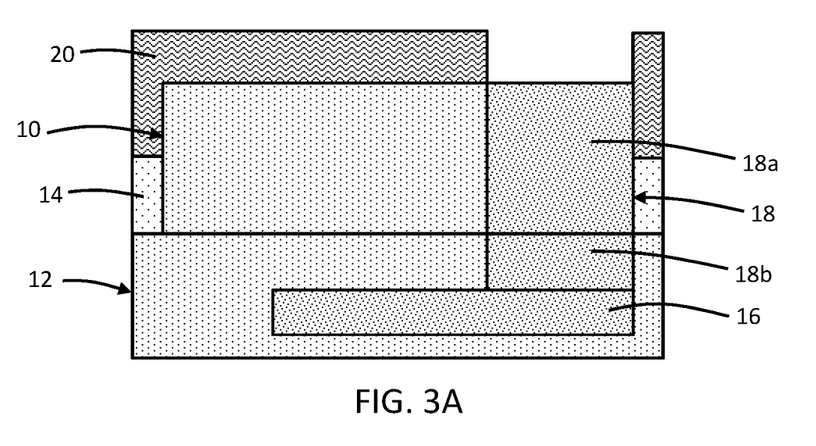
FIG. 3A is a cross-sectional view taken generally along line 3A-3A in FIG. 3.

With reference to FIGS. 3, 3A in which like reference numerals refer to like features in FIG. 2 and at a subsequent fabrication stage, a well 18 is formed that includes a section 18a in each of the fins 10 and a section 18b in the substrate 12 directly beneath the sections 18a in the fins 10. The well 18 may contain a concentration of a dopant introduced by, for example, ion implantation into the fins 10 and substrate 12. To that end, an implantation mask 20 may be formed to cover and mask an area over the fins 10 and substrate 12 such that the fins 10 and substrate 12 are partially masked. The implantation mask 20 may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the well 18. In an embodiment, the semiconductor materials of the deep well 16 and the well 18 may have the same conductivity type, and the well 18 may be contiguous with the deep well 16. In an embodiment, the semiconductor material of the well 18 may be doped with an n-type dopant (e.g., phosphorus (P) and/or arsenic (As)) that provides n-type conductivity. The implantation mask 20 has a thickness and stopping power sufficient to block the masked regions of the fins 10 and substrate 12 against receiving a dose of the implanted ions. The implantation mask 20 is stripped after performing the implantation.

Figure 4:
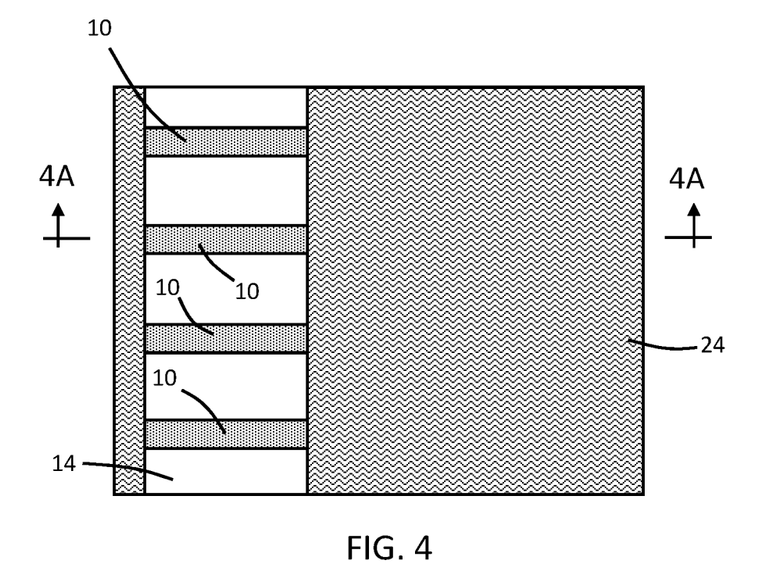
FIG. 4 is a top view of the device structure at a fabrication stage of the processing method subsequent to FIGS. 3, 3A.
Figure 4A:
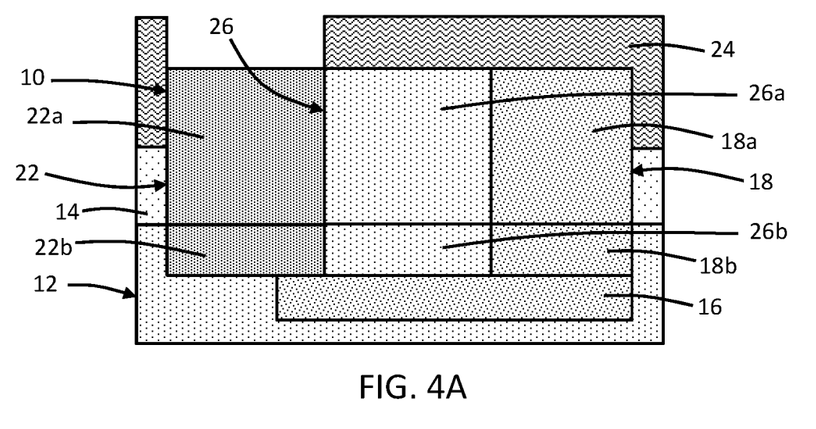
FIG. 4A is a cross-sectional view taken generally along line 4A-4A in FIG. 4.

With reference to FIGS. 4, 4A in which like reference numerals refer to like features in FIGS. 3, 3A and at a subsequent fabrication stage, a well 22 is formed that includes a section 22a in the fins 10 and a section 22b in the substrate 12 directly beneath the sections 22a in the fins 10. The well 22 may contain a concentration of a dopant introduced by, for example, ion implantation into the fins 10 and substrate 12 such that the fins 10 and substrate 12 are partially masked. To that end, an implantation mask 24 may be formed to cover and mask an area over the fins 10 and substrate 12, including the area over the well 18. The implantation mask 24 may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the well 22. The semiconductor material of well 22 is doped to have an opposite conductivity type from the semiconductor material of well 18. In an embodiment, the semiconductor material of well 22 may be doped with a p-type dopant (e.g., boron (B) and/or indium (In)) that provides p-type electrical conductivity. The implantation mask 24 has a thickness and stopping power sufficient to block the masked regions of the fins 10 and substrate 12 against receiving a dose of the implanted ions. The implantation mask 24 is stripped after performing the implantation.

A drain extension 26 is defined that includes a section 26a in each of the fins 10 and a section 26b in the substrate 12 beneath the sections 26a in the fins 10. During the formation of the well 18, the drain extension 26 is masked by the implantation mask 20. Similarly, the drain extension 26 is masked by the implantation mask 24 during the formation of the well 22. The drain extension 26 is laterally arranged between the well 18 of one conductivity type and the well 22 of the opposite conductivity type. The drain extension 26 may have the same conductivity type, such as lightly-doped n-type conductivity, as the well 18 through light doping when the deep well 16 is formed. In an embodiment, the dopant concentration in the drain extension 26 may range from $1 \times 10^{14}$ cm$^{-3}$ to $1 \times 10^{16}$ cm$^{-3}$, and the dopant concentration in the well 18 and the well 22 may range from greater than $1 \times 10^{16}$ cm$^{-3}$ to $1 \times 10^{19}$ cm$^{-3}$. The drain extension 26 has an electrical resistivity that is greater than the electrical resistivity of either of the wells 18, 22.

In each of the fins 10, the section 18a of the well 18 is spaced along the length of the fin 10 from the section 22a of the well 22, and the section 26a of the drain extension is arranged between the section 18a of the well 18 and the section 22a of the well 22. The deep well 16 is arranged in a vertical direction between the well 18 and drain extension 26 and a portion of the substrate 12 beneath the deep well 16. The deep well 16 extends laterally beneath the well 18, the drain extension 26, and a portion of the well 22 that is adjacent to the drain extension 26.

Figure 5:
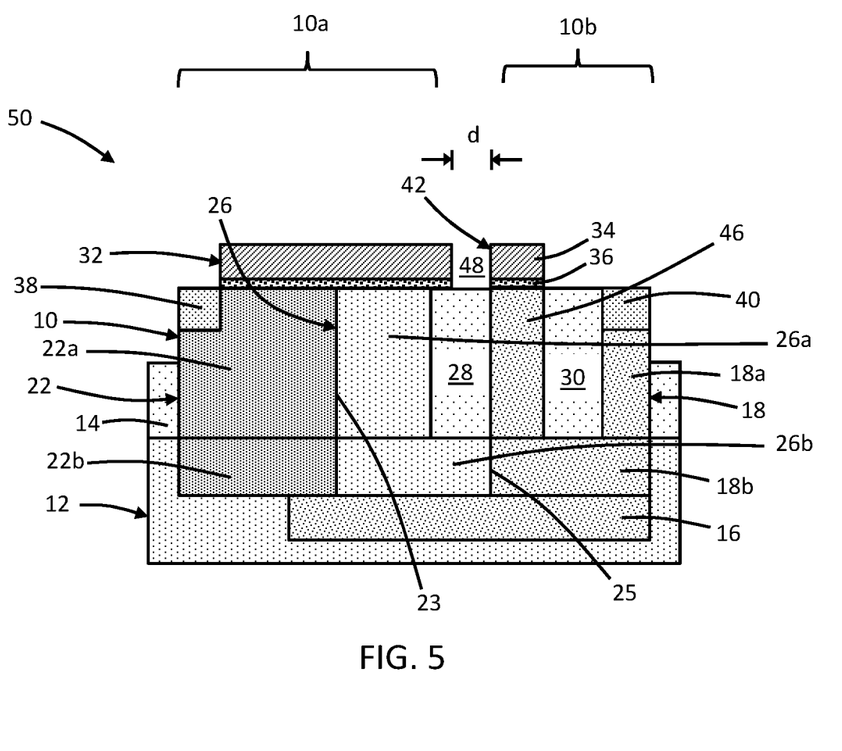
FIGS. 5 and 6 are cross-sectional views of the device structure at successive fabrication stages of the processing method subsequent to FIGS. 4, 4A.
Figure 6:
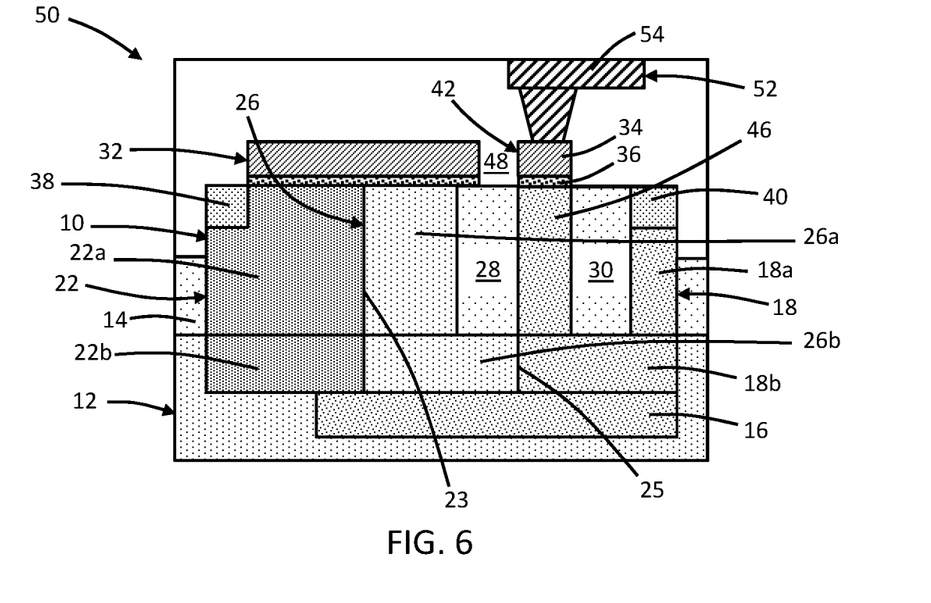

With reference to FIG. 5 in which like reference numerals refer to like features in FIGS. 3, 3A and at a subsequent fabrication stage, shallow trench isolation regions 28, 30 are formed in the fins 10 after forming the wells 18, 22 and drain extension 26 arranged laterally between the well 18 and the well 22. The shallow trench isolation regions 28, 30 may be formed by lithography and etching processes that define spaced-apart trenches extending across the full width of the fins 10 over their full height, and then filling the trenches with a dielectric material, such as an oxide of silicon (e.g., silicon dioxide). The shallow trench isolation regions 28, 30 may terminate depthwise in each fin 10 at or near the interface with the substrate 12.

A gate structure, generally indicated by reference numeral 32, is formed that extends across and overlaps with a section 10a of each fin 10 and with the shallow trench isolation region 28 by a distance, d. The partial overlap with the shallow trench isolation region 28 provides a field plate extension. The well 22 and the drain extension 26 are arranged beneath the gate structure 32.

The gate structure 32 includes a gate electrode 34 and a gate dielectric 36 arranged between the gate electrode 34 and the exterior surface of the fins 10. The gate structure 32 may be formed by depositing a layer stack of different component materials and patterning the deposited layer stack with lithography and etching. The gate electrode 34 may include one or more conformal barrier metal layers and/or work function metal layers, such as layers composed of titanium aluminum carbide (TiAlC) and/or titanium nitride (TiN), deposited by atomic layer deposition, and a metal gate fill layer composed of a conductor, such as tungsten (W), deposited by chemical vapor deposition. The gate dielectric 36 may be composed of a dielectric material, such as a high-k dielectric material like hafnium oxide (HfO$_2$), deposited by atomic layer deposition. In an alternative embodiment, the gate structure 32 may replace a dummy gate structure that is provided as a placeholder structure during a gate-last replacement metal gate process.

A source region 38 of a given conductivity type is formed as a doped region in the section 10a of each fin 10. A contact region 40 of the same conductivity type as the source region 38 is formed as a doped region in a section 10b of each fin 10. The source region 38, which is contained within the section 22a of the well 22 in each fin 10, may contain heavily-doped semiconductor material having an opposite conductivity type from the well 22. The contact region 40, which is arranged in the section 18a of the well 18 in each fin, may contain heavily-doped semiconductor material having the same conductivity type as the well 18. The source region 38 and contact region 40 may be formed by etching the fins 10 and epitaxially growing a doped semiconductor material in the respective etched volumes. In an embodiment in which the well 18 contains n-type semiconductor material and the well 22 contains p-type semiconductor material, the semiconductor material constituting the source region 38 and contact region 40 may be doped with an n-type dopant to provide n-type conductivity and may be heavily doped with the n-type dopant.

The well 22 and the drain extension 26 are contiguous along an interface 23 that is arranged below the gate structure 32 in the section 10a of each fin 10 and the substrate 12 beneath the section 10a of each fin 10. The section 18b of the well 18 and the section 26b of the drain extension 26 are contiguous along an interface 25 that is arranged below the shallow trench isolation region 28 and between the shallow trench isolation region 28 and deep well 16 in a vertical direction. The lateral distance from the source region 38 to the interface 23 represents a channel length of the device.

A portion 46 of the section 18a of well 18 in each fin 10 is arranged in the space between the shallow trench isolation region 28 and the shallow trench isolation region 30. The shallow trench isolation region 28 in each fin 10 is laterally arranged between the portion 46 of the section 18a of well 18 and the section 26a of the drain extension 26. The shallow trench isolation region 30 in each fin 10 is laterally arranged between the portion 46 of the section 18a of well 18 and the contact region 40. The portion 46 of the section 18a of well 18 provides a column of semiconductor material in each fin 10 that extends vertically to the section 18b of well 18 in the substrate 12.

The portion 46 of the section 18a of well 18 extends to the vicinity of the base of the shallow trench isolation region 28 bordering the drain extension 26, which may be a location of significant impact ionization and heat generation during device operation. The portion 46 of the section 18a of well 18, which interrupts the continuity of the shallow trench isolation regions 28, 30, contains semiconductor material that has a higher thermal conductivity than the dielectric material of the shallow trench isolation regions 28, 30.

A dummy gate 42 is arranged over the portion 46 of the section 18a of well 18 that is arranged in the section 10b of each fin 10. The dummy gate 42 may be concurrently patterned with the gate structure 32 from the layer stack used to form the gate structure 32. The dummy gate 42 is used to sink heat that is conducted through the portion 46 of the section 18a of well 18 to the dummy gate 42. The dummy gate 42 is spaced apart from the nearest edge of the gate structure 32 by a space or gap 48 such that the dummy gate 42 and the gate structure 32 have a non-contacting relationship.

The resulting device structure is a laterally-diffused metal-oxide-semiconductor (LDMOS) field-effect transistor 50 that includes the fins 10, the gate structure 32, the source region 38, a body or channel region supplied primarily by the section 22a of the well 22 in the fins 10, the drain extension 26, and a drain region provided by the well 18. The drain extension 26 provides a drift region arranged between the channel region and the drain region of the LDMOS field-effect transistor 50. The drain extension 26, due to its elevated electrical resistivity, generates a voltage drop between the source region and drain region across a relatively long distance within the device structure. During operation, the shallow trench isolation region 28, which is contained entirely inside the fin 10, influences the current path in the drain extension 26 from the source region 38 to the drain region provided by the well 18. The section 26b of the drain extension 26 in the substrate 12 may permit the LDMOS field-effect transistor 50 to operate with a significantly higher breakdown voltage, which expands the safe operating area (SOA) of the device structure.

With reference to FIG. 5 in which like reference numerals refer to like features in FIG. 4 and at a subsequent fabrication stage, an interconnect structure, generally indicated by reference numeral 52, is formed by middle-of-line (MOL) processing and back-end-of-line (BEOL) processing. The interconnect structure 52 may include one or more interlayer dielectric layers each composed of a dielectric material, and metallization 54 composed of a metal (such as copper, tungsten, or cobalt) that may be arranged in the one or more interlayer dielectric layers and connected with the LDMOS field-effect transistor 50. For example, the dummy gate 42 may be connected by a contact with wiring of the metallization 54 in the interconnect structure 52, which provides a conductive path for transferring heat generated by the LDMOS field-effect transistor 50 away from the LDMOS field-effect transistor 50 by thermal conduction.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a laterally-diffused metal-oxide-semiconductor field-effect transistor, the structure comprising:
   a substrate;
   a fin that projects from the substrate;
   a channel region and a drain extension in a first section of the fin and the substrate beneath the first section of the fin;
   a source region in the first section of the fin;
   a drain region in a second section of the fin and the substrate beneath the second section of the fin;
   a gate structure over the channel region in the first section of the fin;
   a first trench isolation region arranged in the fin between the first section of the fin and the second section of the fin;
   a dummy gate over a portion of the second section of the fin;
   a second trench isolation region in the second section of the fin, the second trench isolation region laterally separated from the first trench isolation region by the portion of the second section of the fin; and
   a contact region in the second section of the fin,
   wherein the second trench isolation region is arranged between the contact region and the portion of the second section of the fin, the drain region and the source region have a first conductivity type, the channel region has a second conductivity type opposite from the first conductivity type, and the contact region has the second conductivity type.

2. The structure of claim 1 wherein the drain extension and the drain region are contiguous in the substrate along an interface beneath the first trench isolation region.

3. The structure of claim 1 wherein the fin has a height relative to the substrate, and the first trench isolation region penetrates through the height of the fin to terminate at an interface between the fin and the substrate.

4. The structure of claim 1 wherein the channel region contains a first dopant concentration, and the drain extension contains a second dopant concentration that is less than the first dopant concentration.

5. The structure of claim 1 wherein the gate structure is further arranged over the drain extension in the first section of the fin, and the gate structure has an overlapping arrangement with the first trench isolation region.

6. The structure of claim 5 wherein the gate structure is spaced apart from the dummy gate over the first trench isolation region by a gap to provide a non-contacting arrangement.

7. The structure of claim 5 wherein the drain extension and the drain region are contiguous along an interface in the substrate beneath the first trench isolation region.

8. The structure of claim 1 wherein the channel region contains a first semiconductor material with a first electrical resistivity, and the drain extension contains a second semiconductor material with a second electrical resistivity that is greater than the first electrical resistivity.

9. A structure for a laterally-diffused metal-oxide-semiconductor field-effect transistor, the structure comprising:
   a substrate;
   a fin that projects from the substrate;
   a channel region and a drain extension in a first section of the fin and the substrate beneath the first section of the fin;
   a source region in the first section of the fin;
   a drain region in a second section of the fin and the substrate beneath the second section of the fin;
   a gate structure over the channel region in the first section of the fin;
   a first trench isolation region arranged in the fin between the first section of the fin and the second section of the fin;
   a dummy gate over a portion of the second section of the fin; and
   a second trench isolation region in the second section of the fin, the second trench isolation region laterally separated from the first trench isolation region by the portion of the second section of the fin,
   wherein the drain region and the source region have a first conductivity type, the channel region has a second conductivity type opposite from the first conductivity type, and
   the drain region extends in the substrate beneath the first trench isolation region and the second trench isolation region.

10. The structure of claim 9 wherein the gate structure is further arranged over the drain extension in the first section of the fin, and the gate structure has an overlapping arrangement with the first trench isolation region.

11. The structure of claim 10 wherein the gate structure is spaced apart from the dummy gate over the first trench isolation region by a gap to provide a non-contacting arrangement.

12. The structure of claim 10 wherein the drain extension and the drain region are contiguous along an interface in the substrate beneath the first trench isolation region.

13. The structure of claim 9 wherein the fin has a height relative to the substrate, and the first trench isolation region penetrates through the height of the fin to terminate at an interface between the fin and the substrate.

14. The structure of claim 9 wherein the channel region contains a first dopant concentration, and the drain extension contains a second dopant concentration that is less than the first dopant concentration.

15. A structure for a laterally-diffused metal-oxide-semiconductor field-effect transistor, the structure comprising:
   a substrate;
   a fin that projects from the substrate;

a channel region and a drain extension in a first section of the fin and the substrate beneath the first section of the fin;

a source region in the first section of the fin;

a drain region in a second section of the fin and the substrate beneath the second section of the fin;

a gate structure over the channel region in the first section of the fin;

a trench isolation region arranged in the fin between the first section of the fin and the second section of the fin; and a dummy gate over a portion of the second section of the fin, wherein the drain region and the source region have a first conductivity type, the channel region has a second conductivity type opposite from the first conductivity type, and the drain extension and the drain region are contiguous along a first interface in the substrate beneath the trench isolation region.

16. The structure of claim 15 wherein the gate structure is further arranged over the drain extension in the first section of the fin, and the gate structure has an overlapping arrangement with the trench isolation region.

17. The structure of claim 16 wherein the gate structure is spaced apart from the dummy gate over the trench isolation region by a gap to provide a non-contacting arrangement.

18. The structure of claim 15 wherein the fin has a height relative to the substrate, and the first trench isolation region penetrates through the height of the fin to terminate at a second interface between the fin and the substrate.

19. The structure of claim 15 wherein the channel region contains a first dopant concentration, and the drain extension contains a second dopant concentration that is less than the first dopant concentration.

* * * * *